United States Patent
Varadarajan

(10) Patent No.: US 6,765,411 B1
(45) Date of Patent: Jul. 20, 2004

(54) SWITCHABLE VOLTAGE CLAMP CIRCUIT

(75) Inventor: Hemmige D. Varadarajan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/330,558

(22) Filed: Dec. 30, 2002

(51) Int. Cl.$^7$ .......................................... H03K 19/0175
(52) U.S. Cl. ............................. 326/81; 326/83; 326/88; 327/390; 327/391
(58) Field of Search ............................. 326/81, 82, 83; 327/390, 391, 437, 537, 589

(56) References Cited

U.S. PATENT DOCUMENTS

| | | | | |
|---|---|---|---|---|
| 5,672,992 A | * | 9/1997 | Nadd | .......................... 327/390 |
| 6,304,485 B1 | * | 10/2001 | Harari et al. | .......... 365/185.09 |
| 6,563,724 B2 | * | 5/2003 | Carsten | ........................ 363/89 |

\* cited by examiner

*Primary Examiner*—Vibol Tan
(74) *Attorney, Agent, or Firm*—Fleshner & Kim, LLP

(57) ABSTRACT

Embodiments of the present invention relate to a voltage clamp circuit including a transistor and a switch. The switch is coupled between a gate of the transistor and a source or a drain of the transistor. Embodiments of the present invention can quickly raise and lower a voltage level supplied to a memory device.

39 Claims, 4 Drawing Sheets

SWITCHABLE VOLTAGE CLAMP CIRCUIT

BACKGROUND OF THE INVENTION

1. Field of the Invention

The present invention relates to electronics and in some embodiments a voltage clamp circuit.

2. Background of the Related Art

As electronic devices get smaller and faster, limitations or complications become an issue. For example, miniaturized electronics are sensitive to temperature. When a miniature electronic device operates, some heat is generated. If heat generated in a miniature electronic device is too high, then the miniature electronic device may not operate properly. In some circumstances, a miniature electronic device may actually break due to excessive heat. Additionally, as miniaturized electronic devices are implemented in mobile devices, an amount of power that the electronic device consumes may be a limitation. For instance, in a laptop computer, power may be supplied to an electronic device (e.g. a processor) through a battery. A laptop battery may have a limited amount of power storage capacity. Accordingly, the less energy that electronics of a laptop consume, the longer the laptop can operate on a battery. Accordingly, there has been a long felt need to minimize heat dissipated in electronics and/or to minimize power consumed by electronics.

DETAILED DESCRIPTION OF PREFERRED EMBODIMENTS

Electrical hardware (e.g. a computer) may include many electrical devices. In fact, a computer may include millions of electrical devices (e.g. transistors, resistors, and capacitors). These electrical devices must work together in order for hardware to operate correctly. Accordingly, electrical devices may be electrically coupled together. This coupling may be either direct coupling (e.g. direct electrical connection) or indirect coupling (e.g. electrical communication through a series of components).

Figure 1:
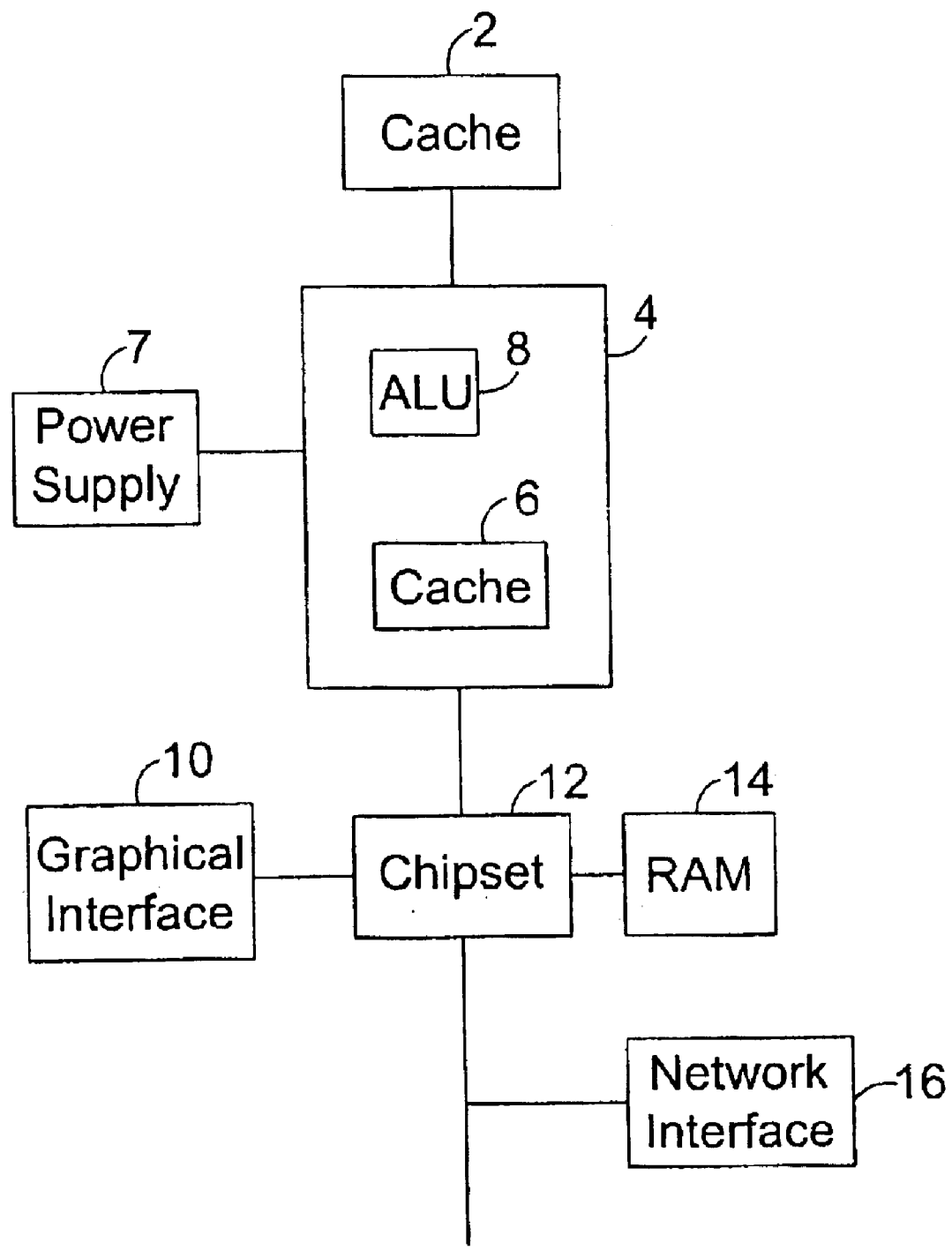
FIG. 1 is an exemplary illustration of components included in a computer system.

FIG. 1 is an exemplary global illustration of a computer. The computer may include a processor 4, which acts as a brain of the computer. Processor 4 may be formed on a die. Processor 4 may include an Arithmetic Logic Unit (ALU) 8 and may be included on the same die as processor 4. ALU 8 may be able to perform continuous calculations in order for processor 4 to operate. Processor 4 may include cache memory 6 which may be for temporarily storing information. Cache memory 6 may be included on the same die as processor 4. The information stored in cache memory 6 may be readily available to ALU 8 for performing calculations. A computer may also include an external cache memory 2 to supplement internal cache memory 6. Power supply 7 may be provided to supply energy to processor 4 and other components of a computer. A computer may include a chip set 12 coupled to processor 4. Chip set 12 may intermediately couple processor 4 to other components of the computer (e.g. graphical interface 10, Random Access Memory (RAM 14, and/or a network interface 16). One exemplary purpose of chip set 12 is to manage communication between processor 4 and these other components. For example, graphical interface 10, RAM 14, and/or network interface 16 may be coupled to chip set 12.

In embodiments of the present invention, memory (e.g. cache 6 or cache 2) may operate at a voltage level which is different than an operating voltage level of processor 4. It may be desirable, in embodiments for hardware components to operate at a lower voltage level than processor 4 to reduce leakage current and/or minimize power loss. ALU 8 and cache 6 may be part of processor 4. ALU 8 and cache 6 may operate at the same voltage level (e.g. 1 volt). Since ALU 8 and cache 6 may be formed on the same die, ALU 8 and cache 6 may have similar semiconductor components. Accordingly, the same voltage level may be appropriate for operating both ALU 8 and cache 6. However, ALU 8 and cache 6 may be structurally different In fact, cache 6 may actually operate more optimally at a voltage that is less than the operating voltage of ALU 8. For instance, if ALU 8 and cache 6 are operated at the same voltage level, there may be unnecessary leakage current produced at cache 6. This leakage current may be disadvantageous as it increases the temperature of processor 4. This possible unnecessary increase in temperature may conflict with the ability of ALU 8 to operate at an optimal speed or capacity. In other words, unnecessary leakage current may produce an undesirable contribution to a temperature budget of processor 4. Additionally, unnecessary leakage current may cause increase in power loss to cache 6. Such power loss, due to leakage current, may be undesirable as a computer system comprising cache 6 may require more power to operate.

Cache 6 or cache 2 may hold data, so it can be utilized by ALU 8. Similarly, RAM 14 may also hold data that can be easily accessed by processor 4. As cache 2, cache 6, and/or RAM 14 hold data that is readily accessible, these memories consume power from a power supply (e.g. power supply 7). However, when a computer or processor goes into an inactive state (e.g. a sleep mode), the data in cache 2, cache 6, and/or RAM 14 may need to be maintained but readily accessible. Accordingly, a voltage level supplied to cache 2, cache 6, and/or RAM 14 may be reduced (thereby reducing leakage current and power consumption) to a level low enough to maintain the data stored in these memories. Further, the voltage may be lowered significantly, such that data in these memories is maintained but leakage current is minimized. It may be desirable when a computer or processor exits an inactive state and enters an active state that data in memory become readily accessible in a short amount of time. In other words, it may be desirable for a supply voltage to cache 2, cache 6, and/or RAM 14 to be quickly and accurately increased to a higher operating level when these memories enter into an active state.

It may be desirable that when a voltage level is reduced in a memory (e.g. cache 2, cache 6, and/or RAM 14) that voltage supplied to the memory be maintained at a consistent level. In other words, it is important that a mechanism that varies a voltage level in a memory adequately sink current during power fluctuations. One of ordinary skill in the art would appreciate that the demands on memories discussed above also exist in other circuit arrangements. Accordingly, embodiments of the present invention may be readily applied to other devices that are not memory devices.

Figure 2:
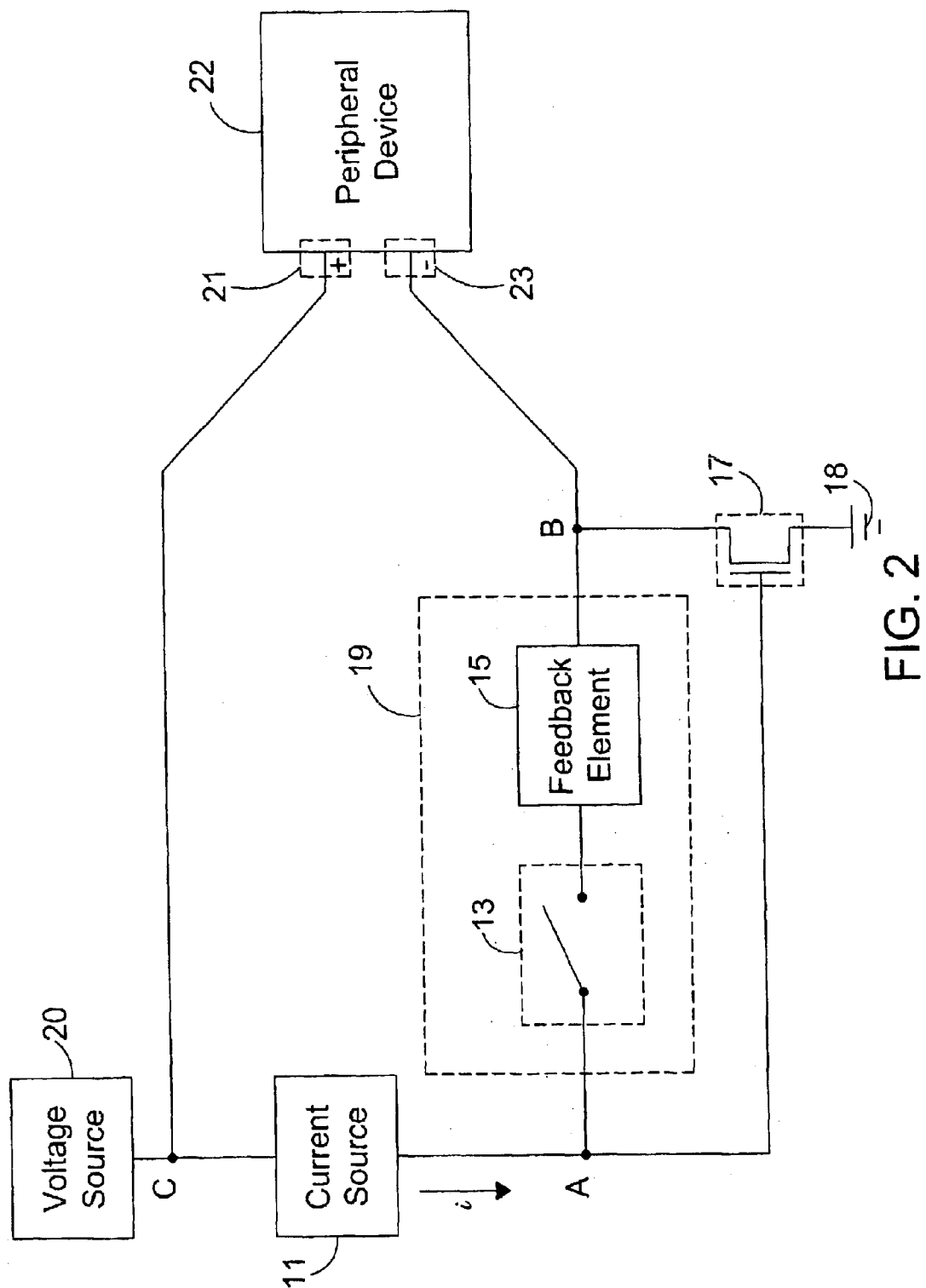
FIG. 2 is an exemplary illustration of a voltage clamping circuit.

FIG. 2 illustrates embodiments of the present invention. Components of FIG. 2 are provided to vary a voltage level supplied to a peripheral device 22. Peripheral device 22 may be any electrical component. In embodiments, peripheral device 22 is a cache memory or a random access memory. Voltage source 20 may be coupled to positive terminal 21 of peripheral device 22 at node C. Transistor 17 may be connected between ground 18 and negative terminal 23 of peripheral device 22 at node B. Current source 11 may be connected between voltage source 20 at node C and a gate of transistor 17 at node A. Feedback network 19 may include switch 13 and/or feedback element 15. Feedback network 19 may be connected between a gate of transistor 17 at node A and a source or drain of transistor 17 at node B. Feedback element 15 may include at least one device.

Operation of the exemplary embodiments illustrated in FIG. 2 will be described in conjunction with the timing diagrams illustrated in FIGS. 3A, 3B, 3C, and 3D. When switch 13 is in an OFF state, substantially all of the voltage from voltage source 20 is applied to the gate of transistor 17. Accordingly, transistor 17 is highly conductive between the source and the drain. When transistor 17 is highly conductive, node B has a voltage level that is substantially the same as ground 18 (e.g. 0V). Accordingly, a voltage swing across positive terminal 21 and negative terminal 23 of peripheral device 22 may be substantially the voltage difference between voltage source 20 and ground 18.

As illustrated in FIGS. 3A, 3B, 3C, and 3D, when switch 13 is in an OFF state, the voltage at node A is $V_{high}$ and the voltage at node B is substantially 0. Additionally, the current at current source 11 is at a low level ($i_{low}$).

When switch 13 is in an ON state, current flows to both the gate of transistor 17 and to node B. Current supplied to node B may be either supplied to peripheral device 22 or go through transistor 17 to ground 18. When switch 13 is in an ON state, the voltage level at node A ($V_{low}$) is decreased. A voltage drop from voltage source 20 to ground may be divided between current source 11, switch 13, feedback element 15, and/or transistor 17. Accordingly, when the voltage level at node A decreases, the voltage applied to the gate of transistor 17 is reduced.

Accordingly, the operation of transistor 17 changes from a highly conductive state to a less conductive state. Accordingly, a voltage drop may exist between the source and the drain of transistor 17 when switch 13 is in an ON state. Potential between node B and ground may be increased to a clamping voltage ($V_{clamp}$). In other words, when switch 13 is in an ON state, a voltage drop across feedback element 15 may serve as feedback to the gate of transistor 17, putting transistor 17 in a moderately conducting state. A moderately conducting state may produce a voltage drop across transistor 17. By increasing the potential at node B from essentially zero to a clamping voltage ($V_{clamp}$), a voltage drop between positive terminal 21 and negative terminal 23 of peripheral device 22 is reduced. Accordingly, a lower voltage supply is provided to peripheral device 22. Further, the lower voltage supply may be consistently maintained, regardless of power consumed by peripheral device 22.

Figure 3:
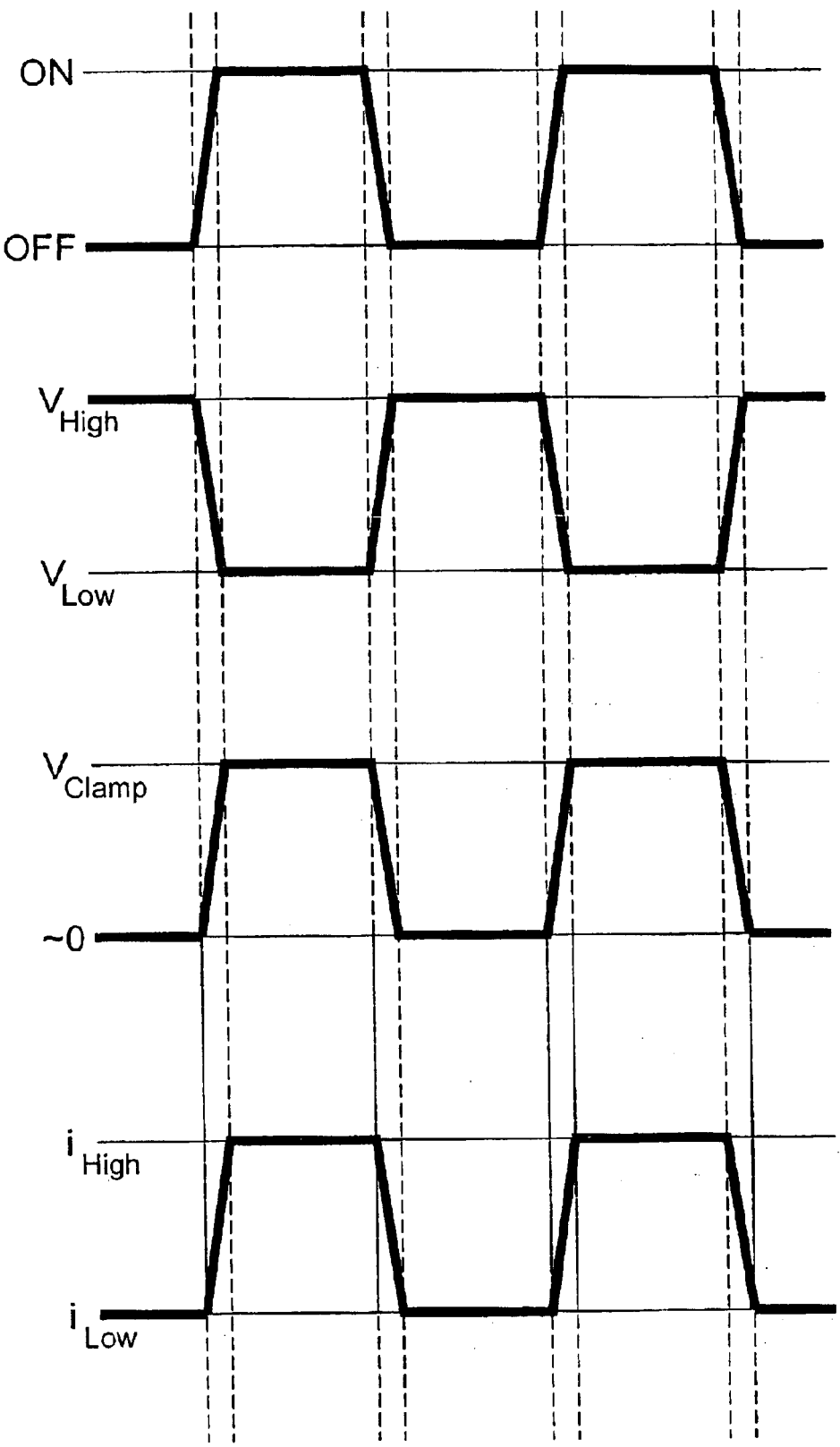
FIGS. 3A, 3B, 3C, and 3D are exemplary timing diagrams of a voltage clamping circuit.

FIG. 3A illustrates switch 13 in both an ON state and an OFF state. FIG. 3C illustrates a timing diagram of the voltage at node B when switch 13 is in either an ON state or an OFF state. For instance, when switch 13 is OFF, node B is substantially grounded at 0 volts. When node B is grounded, a voltage swing between positive terminal 21 and negative terminal 23 of peripheral device 22 is substantially the voltage level supplied by voltage source 20. However, when switch 13 is ON, the voltage level at node B is at a clamping voltage ($V_{clamp}$). Accordingly, when node B is at a clamping voltage, the voltage between positive terminal 21 and negative terminal 23 of peripheral device 22 is reduced.

FIG. 3B illustrates the relationship between a state of switch 13 and the voltage at node A. When switch 13 is in an OFF state, node A is at a relatively high voltage ($V_{High}$). When switch 13 is in an OFF state, node A may be substantially at the voltage level of voltage source 20. Accordingly, a relatively high voltage may be supplied to the gate of transistor 17, making transistor 17 highly conductive. A highly conductive state essentially grounds node B so that a voltage difference between positive terminal 21 and negative terminal 23 of peripheral device 22 is substantially the voltage difference between voltage source 20 and ground 18. When switch 13 is in an ON state, the voltage level at node A is lowered to ($V_{low}$). When switch 13 is in an ON state, a voltage level from power source 20 may be shared between current source 11, switch 13, feedback element 15, and/or transistor 17. Since node A is connected to the gate of transistor 17, when the voltage at node A is reduced, transistor 17 is in a less conductive state and a voltage potential is formed between the source and the drain of transistor 17. A voltage level at transistor 17 increases the voltage level at node B and thereby reduces the voltage potential between positive terminal 21 and negative terminal 23 of peripheral device 22.

When switch 13 is ON, feedback is provided through the gate of transistor 17. Alternatively, when switch 13 is OFF, feedback is provided to the gate of transistor 17 and may cause transistor 17 to be in a highly conductive state. Accordingly, by turning on and off switch 13, the voltage between positive terminal 21 and negative terminal 23 of peripheral device 22 can be raised and lowered very quickly. In embodiments, the voltage level between positive terminal 21 and negative terminal 23 of peripheral device 22 may be permanently lowered. In these embodiments, switch 13 may be permanently in an ON state. Alternatively, instead of switch 13 being permanently in an ON state, switch 13 may be eliminated by connecting feedback element 15 between nodes A and B.

FIG. 3D illustrates the current level from current source 11 in relation to switch 13 being turned on and off When switch 13 is in an OFF state, current from current source 11 may only flow to the gate of transistor 17. Accordingly, as there may be virtually no current flowing between the gate of transistor 17 and ground 18, current i may be minimized at a low current ($i_{low}$). Alternatively, when switch 13 is in an ON state, current i may flow through switch 13, through feedback element 15, and between the source and the drain of transistor 17. Accordingly, when switch 13 is in an ON state, the current through current source 11 is increased to a higher state ($i_{High}$).

Figure 4:
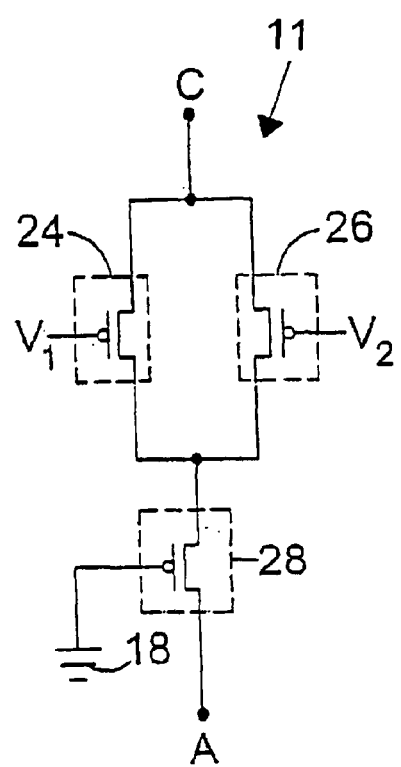
FIG. 4 is an exemplary illustration of a current source of a voltage clamping circuit.

FIG. 4 illustrates embodiments of the present invention, wherein current source 11 comprises transistor 28. A source or drain of transistor 28 is connected to node A. An inverted gate input of transistor 28 is grounded to ground 18. Accordingly, transistor 28 is always in a highly conductive state. In embodiments, transistor 24 and/or transistor 26 may be connected to transistor 28 to supplement transistor 28 as a current source. Transistor 24 and/or transistor 26 may have inverted inputs at their gates. Further, transistor 24 and/or transistor 26, may receive control signals $V_1$ and/or $V_2$ to adjust an amount of current supplied to node A. In embodiments of the present invention, input $V_1$ and input $V_2$ may be provided to improve the performance of transistor 28 as a current source. In embodiments of the present invention, input $V_1$ and input $V_2$ may be provided to tailor a clamped voltage at node B.

Figure 5:
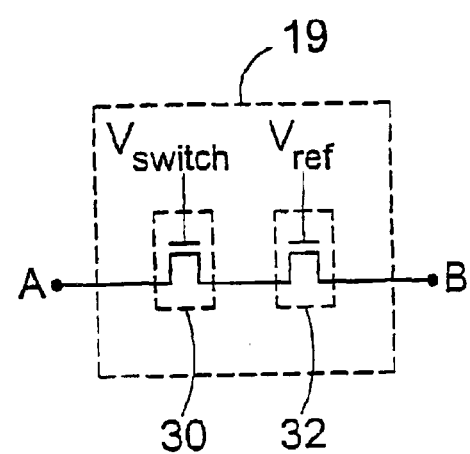
FIG. 5 is an exemplary illustration of a switch and a feedback element.

FIG. 5 is an exemplary illustration of embodiments of switch 13 and/or feedback element 15. In embodiments, switch 13 may comprise transistor 30. Transistor 30 may receive a signal ($V_{switch}$) at the gate of transistor 30. Accordingly, when the signal of $V_{switch}$ is a high voltage level, transistor 30 may be in a conducting state between the source and the drain. Likewise, when the signal of $V_{switch}$ is a low voltage level (e.g. 0V) at the gate of transistor 30, transistor 30 may be in a non-conducting state between the source and the drain. When transistor 30 is in a non-conducting state, transistor 30 may be in an OFF state. When transistor 30 is in a conducting state, transistor 30 may be in an ON state.

In embodiments of the present invention, feedback element 15 may comprise transistor 32. Transistor 32 may receive a signal at its gate ($V_{ref}$) to tailor a voltage drop across the source and the drain of transistor 32. A voltage drop across transistor 32 may be in accordance with signal $V_{ref}$ and current flowing between the source and the drain of transistor 32. If there is a voltage drop across transistor 32, transistor 32 may operate as a variable resistor. The amount of the voltage drop provides feedback to transistor 17. In embodiments of the present invention, control signal $V_{ref}$ will be tailored according to voltage signals $V_1$ and $V_2$ to transistors 24 and 26, respectively. Accordingly, a voltage drop across transistor 32 may be coordinated according to an anticipated amount of current flowing between node A and node B.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus comprising:
a first transistor;
a switch coupled between a gate of the first transistor and a source of the first transistor or a drain of the first transistor;
a first node; and
a second node coupled to the source or the drain of the first transistor, the switch to operate so as to change a voltage difference between the first node and the second node, wherein a peripheral component is coupled to the source of the first transistor or the drain of the first transistor at the second node and the peripheral component is also coupled to the first node.

2. The apparatus of claim 1, further comprising a feedback element between the gate of the first transistor the and source of the first transistor or drain of the first transistor.

3. The apparatus of claim 2, wherein the feedback element comprises a second transistor.

4. The apparatus of claim 3, wherein the second transistor exhibits voltage difference between a source of the second transistor and a drain of the second transistor according to a reference voltage applied to a gate of the second transistor.

5. The apparatus of claim 4, wherein the reference voltage applied to the gate of the second transistor is according to an amount of current generated at a current source.

6. The apparatus of claim 1, further comprising a current source coupled to the gate of the first transistor.

7. The apparatus of claim 6, wherein the current source comprises a third transistor.

8. The apparatus of claim 7, wherein the switch is coupled between the source of the first transistor or the drain of the first transistor and a source of a third transistor or a drain of the third transistor.

9. The apparatus of claim 1, wherein the peripheral component is a memory device.

10. The apparatus of claim 9, wherein the memory device is cache memory.

11. The apparatus of claim 1, wherein the peripheral component is comprised on a die of a processor.

12. The apparatus of claim 1, wherein the switch is an on/off switch.

13. The apparatus of claim 1, wherein the switch comprises a fourth transistor.

14. The apparatus of claim 13, wherein the fourth transistor is coupled between the gate of the first transistor and the source of the first transistor or the drain of the first transistor.

15. The apparatus of claim 13, wherein a voltage applied to a gate of the fourth transistor controls the switch.

16. The apparatus of claim 1, wherein the first node and the second node couple to an off-die device.

17. A method comprising toggling a switch coupled between a gate of a first transistor and a source of the first transistor or a drain of the first transistor so as to change a voltage difference between a first terminal and a second terminal, wherein a peripheral component is coupled to the source of the first transistor or the drain of the first transistor at first the terminal and the peripheral component is also coupled to the second terminal.

18. The method of claim 17, wherein a feedback element is arranged between the gate of the first transistor and the source of the first transistor or the drain of the first transistor.

19. The method of claim 17, wherein a current source is coupled to the gate of the first transistor.

20. The method of claim 17, wherein the switch is an on/off switch.

21. The method of claim 17, wherein the switch comprises a second transistor.

22. The method of claim 21, wherein the second transistor is coupled between the gate of the first transistor and the source of the first transistor or the drain of the first transistor.

23. A system comprising:
a die comprising a microprocessor, the microprocessor including a first terminal and a second terminal; and
an off-die component in communication with the microprocessor, the off-die component including a third terminal to couple with the first terminal of the microprocessor and a fourth terminal to couple with the second terminal of the microprocessor, wherein the microprocessor comprises:
a first transistor; and
a switch coupled between a gate of the first transistor and a source of the first transistor or a drain of the first transistor.

24. The system of claim 23, wherein the off-die component is a cache memory.

25. The system of claim 23, wherein the off-die component is a chip set.

26. The system of claim 23, wherein the off-die component is random access memory.

27. The system of claim 23, wherein the off-die component is a network interface.

28. The system of claim 23, wherein the off-die component is a graphical interface.

29. An apparatus comprising:

a first transistor;

a switch coupled between a gate of the first transistor and a source of the first transistor or a drain of the first transistor; and a feedback element between the gate of the first transistor and the source of the first transistor or the drain of the first transistor, wherein the feedback element comprises a second transistor.

30. The apparatus of claim 29, wherein the second transistor exhibits voltage difference between a source of the second transistor and a drain of the second transistor according to reference voltage applied to a gate of the second transistor.

31. The apparatus of claim 30, wherein the reference voltage applied to the gate of the second transistor is according to an amount of current generated at a current source.

32. A die comprising:

a first transistor;

a switch coupled between a gate at the first transistor and a source of the first transistor or a drain of the first transistor;

a first external terminal; and a second external terminal coupled to the source or the drain of the first transistor, the switch to operate so a change a voltage difference between the first external terminal and the second external terminal.

33. The die of claim 32, further comprising a feedback element between the gate of the first transistor and the source of the first transistor or the drain of the first transistor.

34. The die of claim 33, wherein the feedback element comprises a second transistor.

35. The die of claim 34, wherein the second transistor exhibits voltage difference between a source of the second transistor and a drain of the second transistor according to a reference voltage applied to a gate of the second transistor.

36. The die of claim 35, wherein the reference voltage applied to the gate of the second transistor is according to an amount of current generated at a current source.

37. A method comprising toggling a switch coupled between a gate of a first transistor and a source of the first transistor or a drain of the first transistor so as to change a voltage difference between a first external terminal of a chip and a second external terminal of a chip.

38. The method of claim 37, wherein a feedback element is arranged between the gate of the first transistor and the source of the first transistor or the drain of the first transistor.

39. The method of claim 37, wherein a current source is coupled to the gate of the first transistor.

* * * * *